United States Patent [19]
Taylor

[11] Patent Number: 6,031,768
[45] Date of Patent: Feb. 29, 2000

[54] SELF BOOSTED WORDLINE

[75] Inventor: Ronald Thomas Taylor, Grapevine, Tex.

[73] Assignee: STMicroelectronics, Inc., Carrollton, Tex.

[21] Appl. No.: 09/215,854

[22] Filed: Dec. 18, 1998

[51] Int. Cl.[7] ............................................. G11C 7/00
[52] U.S. Cl. ........................ 365/189.11; 365/189.06; 365/203; 365/204; 365/230.06
[58] Field of Search .................... 365/189.11, 230.06, 365/189.06, 204, 203

[56] References Cited

U.S. PATENT DOCUMENTS

| | | | |
|---|---|---|---|
| 5,835,438 | 11/1998 | Wu et al. | 365/230.06 |
| 5,923,596 | 7/1999 | Wu et al. | 365/189.09 |
| 5,946,264 | 8/1999 | McClure | 365/230.06 |
| 5,949,720 | 9/1999 | Brady | 365/189.06 |

*Primary Examiner*—Andrew Q. Tran
*Attorney, Agent, or Firm*—Therodore E. Galanthay; Lisa K. Jorgenson; Peter J. Thoma

[57] ABSTRACT

This invention is a method for boosting the voltage level of a wordline in a DRAM having bitlines, sense amplifiers, isolation devices, bitline loads, an X decoder device and a Y select device. In the preferred method, when the wordline level reaches VDD, the decoder is disabled causing the wordline to stay at the VDD level. The sensing amplifier is also caused to be isolated so as to allow the wordline voltage to track the bitline voltage through capacitive coupling across the access MOSFET of the memory cell being read or written to. As a result, the wordline voltage is increased to a supervoltage as the bitline voltage increases. After the supervoltage is reached on the wordline, the sensing amplifier is connected causing feedback from the amplifier to drive the wordline voltage toward the VDD level and the disabled bit toward GND during this time. At the end of the wordline clock signal, the voltage is at GND and each of the bitlines are returned to their neutral mid-voltage level.

18 Claims, 2 Drawing Sheets

SELF BOOSTED WORDLINE

CROSS-REFERENCE TO OTHER APPLICATIONS

This application is related to application for patent entitled "Method for Stress Testing a Memory Cell Oxide of a DRAM", U.S. application Ser. No. 09/215,855, now allowed, which was filed on the same date as this application; and to an application entitled "Voltage Clamping Method and Apparatus for Dynamic Random Access Memory Device", U.S. application Ser. No. 09/183,054, which was filed on Oct. 30, 1998 now U.S. Pat. No. 5,949,720; both of which are assigned to the assignee hereof and are incorporated hereby in reference.

BACKGROUND OF THE INVENTION

This invention is directed to self boosted wordlines and more particularly to boosting wordlines in a DRAM through wordline to bitline capacitive coupling.

FIG. 1 shows a critical bitline and wordline (X) decoder circuitry of a prior art folded bitline DRAM 10 with an N channel X decoder 20. The circuitry shown in FIG. 1 is prior art except for the bitline load circuit 80a, b, which is described in detail in the aforementioned related application entitled "Voltage Clamping Method and Apparatus for Dynamic Random Access Measuring Device," which is incorporated herein by reference.

In DRAM 10 of FIG. 1, memory blocks 40a, 40b, 40c, and 40d each have two memory cells (i.e., access MOSFETS mc 42a, a'; 42b, b'; 42c, c'; 42d, d', respectively). Each memory cell 42a, a' -d, d' has one capacitor 44a, a' -d, d', respectively. Access MOSFETs mc (42a, a' -d-d') are arranged in a linear sequence (hereinafter called the X direction) to form two bitlines 16a, b of a multi-bitline DRAM 10. If the memory cells are grouped into pairs where alternating wordlines w10 (No. 18a in FIG. 1), w12, . . . , wln−2 (18c) connect memory cells 40a–d to a bitline wire 110 designated bt in FIG. 1, and alternating wordlines w11 (18b), w13, . . . , wln−1 (18d) connect memory cells to a bitline wire 112 adjacent to bt and designated as bc in FIG. 1, then bitline wires bt (110) and bc (112) are said to be half bitlines. This adjacency of half bitlines is called a folded bitline architecture and is the preferred arrangement of memory cells in DRAMs in commercial production today. Completing the two bitlines 16a, 16b are precharge devices 30a, b comprising MOSFETS mpt (32a, b), mpc (34a, b) and mp (36a, b), respectively; isolation devices 50a, b comprising isolation MOSFETS mit (52a, b) and mic (54a, b), respectively, which could in some applications be N channel depletion MOSFETS, P channel MOSFETS or even CMOS transmission gates; a sense amplifier 60a, b; and finally; bitline access (Y Select) device 70a, b comprising MOSFETS which could in some applications be CMOS transmission gates or, even P channel MOSFETS.

In DRAM 10, memory cells 40a–d store the data. In order for there to be efficient utilization of silicon area in a memory device, it is advantageous to have as many of these memory cells as possible in each bitline 16a, b. For n memory cells connected to a single bitline, each memory cell is connected to a unique wordline so as to generate a sequence of wordlines designated w10 (No. 18a in FIG. 1), w11 (No. 18b in FIG. 1), w12, . . . , wln−2 (No. 18c in FIG. 1), wln−1 (No. 18d in FIG. 1). Multiple bitlines placed adjacent to one another form a rectangular array of m bitlines designated bitline0 (No. 16a in FIG. 1), bitline1 (not shown), . . . , bitlinem−1 (16b) and connected together by n wordlines and a few control signals such as pblt (taken off pblt node 122), sense (taken off node 129), etc. In a modern DRAM, for each array, typically the number of wordlines n=255, and the number of bitlines is m=1023. The DRAM will have a number of such arrays. For any DRAM, the practical upper limits for n, m, and the number of arrays are then constrained by having a large enough signal to be read by the sense amplifier (constraint on n) and by active power consumption (constraint on m and the number of arrays).

The operation of DRAM 20 shown in FIG. 1 is best explained by reference to FIG. 2 which shows idealized waveforms for DRAM 10. While dummy cells are used on most (but not all) DRAMs to supply a fixed offset to sense amplifier 60a, b, the dummy cells have been omitted here to simplify the figures and discussion. It will be appreciated that the invention may be used on DRAMs with or without dummy cells.

Initially, DRAM array 10 is in the inactive precharge state shown at the left edge of the FIG. 2 waveforms. As shown in FIG. 2, wordlines wl0 (No. 18a in FIG. 1) through wln−2 (No. 18c in FIG. 1) and Y select (Nos. 70a, b in FIG. 1) signals YS0 through Ysm−1 are in their low (GND) state rendering all memory cell access MOSFETS (Nos. 42a, a'-d, d' in FIG. 1) and Y select MOSFETS (Nos. 72a, b and 74a, b in FIG. 1) nonconductive. In FIG. 2, control signals isoc (on isoc node No. 142, in FIG. 1) and pblt (on pblt node 122) are at VDD and control signal isot (on isot node 144 in FIG. 1) is at GND. Since signal pblt (on pblt node No. 122 in FIG. 1) is at VDD, all precharge MOSFETS (Nos. 30a, b in FIG. 1) are in their conductive state precharging all half bitlines bt and bc (Nos. 110 and 112, respectively in FIG. 1) to voltage level vbeq (on vbeq node No. 126 in FIG. 1) whose value is approximately VDD/2 as shown in FIG. 2. Additionally shown in FIG. 2, since the isoc signal (on isoc node No. 142 in FIG. 1) is at VDD and the isot signal (on isot node No. 144 in FIG. 1) is at GND all isolation MOSFETS (Nos. 50a, b in FIG. 1) are in their conductive state precharging sense amplifier (Nos. 60a, b in FIG. 1) nodes t and c (Nos. 62a, 64a of sense amplifier 60a, for example, in FIG. 1) to bitline halves bt and bc respectively (Nos. 110, 112 in FIG. 1) and hence to VDD/2. The sense and restore lines 128, 129 of FIG. 1 are separately precharged to VDD/2 by peripheral circuitry not shown in FIG. 1 and hence all sense amplifier MOSFETS are in a nonconductive state.

Information is read from DRAM 10 through a sequence of operations shown in FIG. 2 beginning on the left hand side of the figure. As shown in FIG. 2, signal pblt (on pblt node No. 122 in FIG. 1) switches to the GND state isolating the bitlines of the selected array and their associated sense amplifier nodes t and c (Nos. 62a, c, for example) from precharge signal vbeq (on vbeq node No. 126 in FIG. 1). One of the n wordline decoders (No. 22 in FIG. 1, for example) is enabled to prepare to connect a memory cell to each bitline in the selected array. This is done by supplying an address on the X decoder address bus which is the output from n channel x decoder 20. Through appropriate logical operations this causes the selected X decoder 22 node a (No. 22a in FIG. 1) to switch to VDD and its node c (No. 22c in FIG. 1) to switch to GND, the latter transition disconnecting the to be activated wordline (wl0 in FIG. 2) (wl0 is shown as 18a in FIG. 1) from the GND node. As node a (Nos. 22a in FIG. 1) rises to VDD, node d (No. 22d in FIG. 1) rises from an intermediate level (shown as VDD-Vtn in FIG. 2) to a voltage that is greater than VDD by at least one N channel threshold voltage (Vtn), thus allowing node b (No. 22b in FIG. 1) to be precharged to VDD. Node d (No. 22d in FIG. 1) is then discharged to VDD or to VDD-Vtn as shown in FIG. 2 rendering MOSFET ma (Nos. 22e in FIG. 1) nonconductive and isolating node b (No. 22b in FIG. 1) at a voltage level of VDD. As there are a number of circuit techniques available to do this in common use in DRAMs a detailed explanation will not be given here.

The memory cell read operation is now initiated by the transition of wordline clock rclk (taken from line No. 29 in FIG. 1) from GND to a boosted or bootstrapped level that is at least Vtn above VDD. Since MOSFET mb (22g in FIG. 1) is in the conductive state wordline Wl0 (No. 18a in FIG. 1) follows rclk taken from rclk node (No. 29 in FIG. 1) from GND to the boosted level. As the rclk signal (on rclk line No. 29 in FIG. 1) and the wl0 signal (on wl0 line No. 18a in FIG. 1) rise, the channel capacitance of MOSFET mb (No. 22g in FIG. 1) increases the voltage of node b (No. 22b in FIG. 1) thus maintaining it in the conductive state. Thus wordline wl0 (No. 18a in FIG. 1) can be fully charged to the final boosted level of rclk (taken from rclk line No. 29 in FIG. 1).

The rise of wordline wl0 (No. 18a in FIG. 1) makes conductive the appropriate memory cell access MOSFETS (mc) (No. 42a, b in FIG. 1) allowing the selected memory cells to discharge to (or be charged from) their respective half bitlines. In FIG. 2, wordline wl0 (No. 18a in FIG. 1) is shown discharging a memory cell to half bitline bt (No. 110 in FIG. 1) thus imparting a slightly greater voltage on half bitline bt relative to bitline bc (No. 112 in FIG. 1) which is not connected to a memory cell. The resulting small voltage difference between half bitlines bt and bc is then propagated through CMOS transmission gates xt and xc (Nos. 52a, b, 54a, b, respectively) onto sense amplifier nodes t and c (Nos. 62a and 64a in FIG. 1, respectively). This small voltage signal can be amplified by the sense amplifier by switching the sense signal (from sense node 129 in FIG. 1) to GND and the restore signal (from restore node 128 in FIG. 1) to VDD. As the operation of the sense amplifier has been described in detail elsewhere and is common to all DRAMs it will not be described in detail here. The final sense amplifier voltages of node c (64a, b in FIG. 1) at GND and node t (node 62a, b in FIG. 1) at VDD are then propagated back through the isolation MOSFETS onto half bitlines bt and bc (Nos. 110 and 112 in FIG. 1, respectively). Finally, after the sense amplifier (Nos. 60a, b in FIG. 1) has been latched, designated Y select MOSFETS (Nos. 72a, 74a in FIG. 1) may be enabled to read the sense amplifier data to peripheral circuits or to allow new data to be written onto the sense amplifier and bitline nodes.

In certain DRAMs it may be inadvisable to allow the low going half bitline bc (No. 112 in FIG. 1) to completely discharge to GND since subthreshold leakage currents passing through deselected memory cell access MOSFETS (mc) (Nos. 42a, a'–d, d' in FIG. 1) may slowly discharge memory cells that are storing a high voltage state (VDD) to low half bitline bc (No. 112 in FIG. 1). To keep this from happening, bitline loads 80a, b having load MOSFETS mit and mic (82a, b, 84a, b, respectively) have been added as described in the related application entitled "Voltage Clamping Method and Apparatus Dynamic Random Access Memory Device", which is incorporated herein by reference. These MOSFETS are biased in a resistive state to limit the final value of bc to approximately 300 mv above GND as shown in FIG. 2.

The DRAM memory array is returned to its inactive state by discharging the wordline to GND thus isolating the memory cells, returning the appropriate Y select signals to their inactive (GND) state and then activating the precharge MOSFETS to precharge the bitline and sense amplifier nodes. After a suitable precharge time another cycle may begin.

In order to economically increase the data storage capacity of DRAMs, the physical sizes of the components used to manufacture them has steadily decreased, driven by advances in process technology. The dielectric thicknesses of the oxide layers in the MOSFETS and capacitors used to fabricate modern DRAMs, for example, are now less than 100 angstroms, and, the voltages applied to these MOSFETS generate electric fields that may cause permanent stress damage to the MOSFET gate memory cell capacitor oxides (Nos. 44a, a'–d, d' in FIG. 1). Wordline access MOSFET mc (Nos. 42a, a'–d, d' in FIG. 1) and mb MOSFETS of deselected x decoders (Nos. 24, 26, 28 in FIG. 1) of DRAM 10 in FIG. 1 are particularly vulnerable because wordlines are driven to extraordinarily high boosted voltages while node bt or bc (Nos. 110, 112 in FIG. 1, respectively) is driven to GND.

SUMMARY OF INVENTION

The invention disclosed here provides a method for changing the operation of a conventional DRAM in a way that boosts the wordline through wordline to bitline capacitive coupling and causes the electric fields applied to the gate oxide of the memory cell access MOSFETS mc to be reduced.

The method is particularly effective in boosting the wordline of a folded bit DRAM comprising memory cells each memory cell having a memory cell reference node vplate, said memory cells being arranged in a linear sequence to form bitlines and grouped into pairs where a first set of alternating wordlines connect memory cells to a half bitline bt and a second set of alternating wordlines connect memory cells to a half bitline bc; a precharge device having a precharge voltage node vbeq; an isolation device having an iso node, a sense amplifier; a bitline access node pblt; an X decoder device; a wordline clock node rclk; and a (Y select) device for generating YS enable/disable signals.

In the preferred method, the voltage level of a wordline in a DRAM is boosted by the steps of: driving said wordline to a first high voltage level by driver circuitry; disconnecting said wordline from said driver circuitry; isolating said bitlines from said sense amplifier so as to allow the wordline voltage to track the voltage of said bitlines; charging said bitlines through said bitline loads; wherein said bitline boosts the voltage on said wordline through capacitive coupling between said wordline and said bitlines. This causes said wordlines to so track the voltage of said bitlines as to be boosted above said first high voltage level to a second higher voltage level.

In the invention, when the wordline level reaches VDD, the decoder MOSFET is disabled causing the wordline to stay at the VDD level. The sensing amplifier is also caused to be isolated so as to allow the wordline voltage to track the bitline voltage through capacitive coupling across the access MOSFET of the memory cell being read or written to. As a result, the wordline voltage is increased to a supervoltage as the bitline voltage increases. Since the sensing amplifier is isolated during this time, the disabled bitline also tracks the enabled bitline through capacitive coupling. After the supervoltage is reached on the wordline, the sensing amplifier is connected to drive the disabled half bitline to GND and, via capacitive coupling, to drive the wordline back to VDD. At the end of the wordline clock signal, the voltage is at GND and each of the bitlines are returned to their neutral mid-voltage level.

BRIEF DESCRIPTION OF THE DRAWINGS

The aforementioned and other features, characteristics, advantages, and the invention in general, will be better understood from the following, more detailed description taken in conjunction with the accompanying drawings in which.

DESCRIPTION OF THE PREFERRED EMBODIMENT

The invention disclosed here provides a method for changing the operation of a conventional DRAM in a way that boosts the wordline through wordline to bitline capacitive coupling and causes the electric fields applied to the gate oxide of the memory cell access MOSFETS mc to be reduced.

The method is particularly effective in boosting the wordline of a folded bit DRAM comprising memory cells each memory cell having a memory cell reference node vplate, said memory cells being arranged in a linear sequence to form bitlines and grouped into pairs where a first set of alternating wordlines connect memory cells to a half bitline bt and a second set of alternating wordlines connect memory cells to a half bitline bc; a precharge device having a precharge voltage node vbeq; an isolation device having an iso node, a sense amplifier; a bitline access node pblt; an X decoder device; a wordline clock node rclk; and a (Y select) device for generating YS enable/disable signals.

In the preferred method, the voltage level of a wordline in a DRAM is controlled by the steps of: driving said wordline to a first high voltage level by driver circuitry; disconnecting said wordline from said driver circuitry; isolating said bitlines from said sense amplifier so as to allow the wordline voltage to track the voltage of said bitlines; charging said bitlines through said bitline loads; wherein said bitline boosts the voltage on said wordline through capacitive coupling between said wordline and said bitlines. This causes said wordlines to so track the voltage of said bitlines as to be boosted above said first high voltage level to a second higher voltage level.

Figure 1:
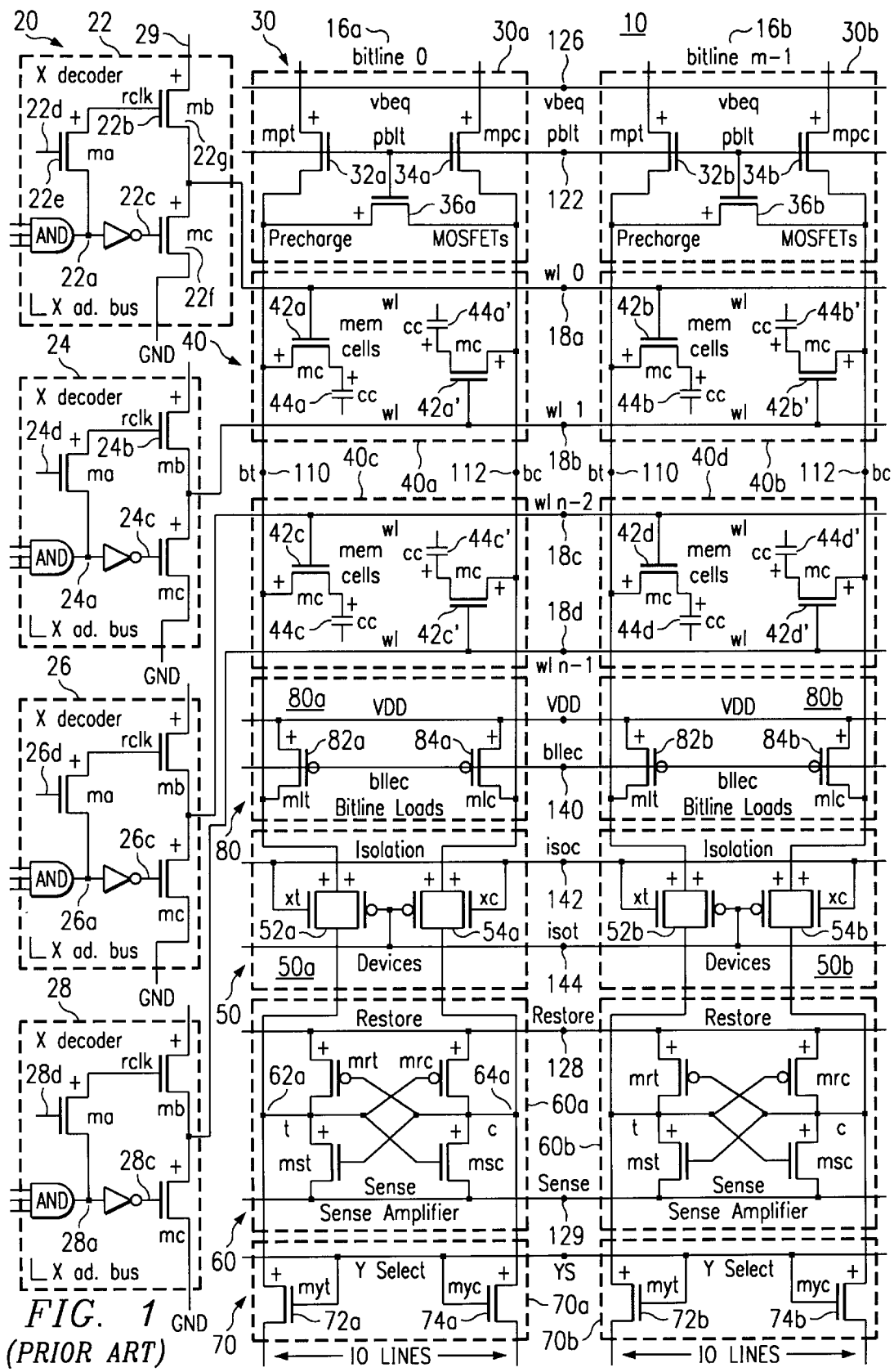
FIG. 1 is a schematic diagram of a prior art folded bitline DRAM 10 with N channel X Decoder 20 and, VDD/2 precharge and cell plate.
Figure 2:
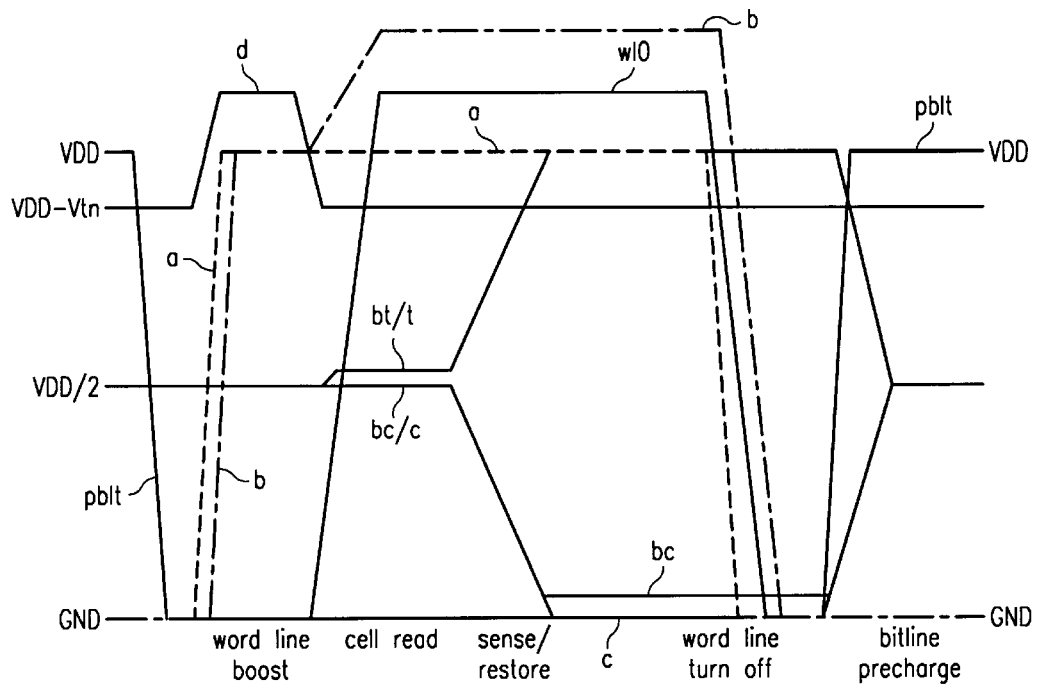
FIG. 2 is a timing diagram of certain signals in the folded bitline DRAM 10 with N channel X Decoder 20 of FIG. 1.
Figure 3:
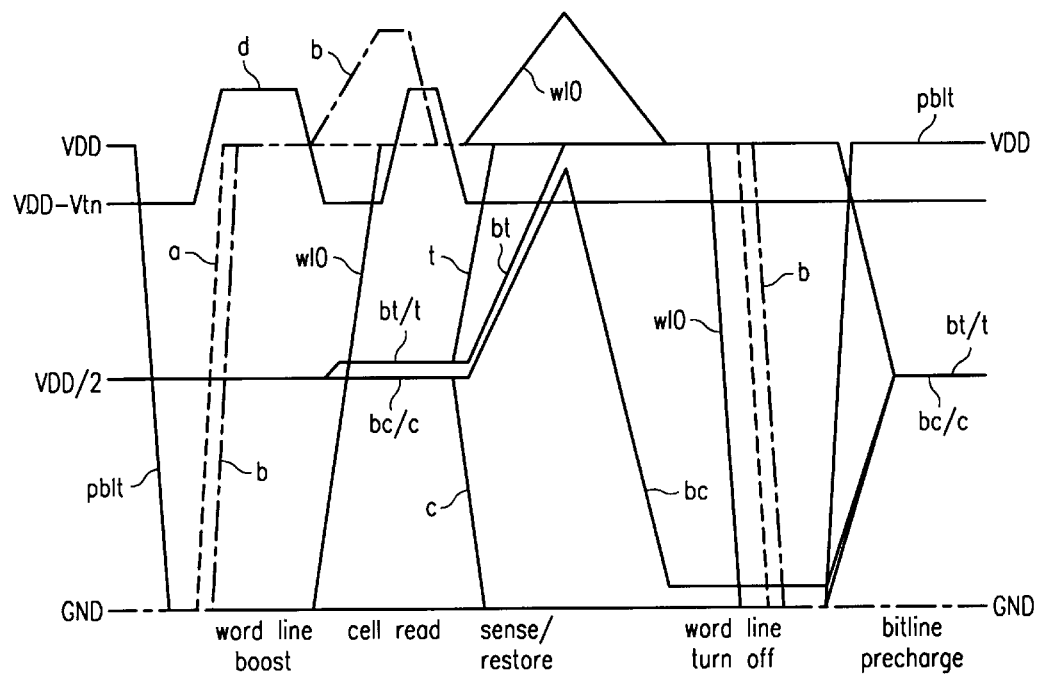
FIG. 3 is a timing diagram of certain signals in folded bitline DRAM 10 with N channel X Decoder 20 of FIG. 1 when the DRAM is operating in a self boosted wordline mode according to the method of this invention.

The operation of DRAM 10 with the invention is best explained by reference to FIG. 3. The initial precharge state is the same as that shown in the prior art DRAM of FIG. 2 as is the initial operation of nodes pblt, a, b, and d (shown in FIG. 1 as Nos. 122, 22a, b, d, respectively). The initial transition of line rclk (No. 29 in FIG. 1) and wordline wl0 (No. 18a in FIG. 1) may but probably is not to a boosted level. If an initial high level of VDD is high enough to discharge a memory cell 40 storing a high voltage level onto half bitline bt (No. 110 in FIG. 1) as shown in FIG. 3 then peripheral rclk boost circuitry (not shown) may be replaced with a simple CMOS driver. This will result in a substantial simplification of the peripheral circuitry although it is not the main intent of the invention.

After wordline wl0 (No. 18a in FIG. 1) has reached VDD or above, the wordline is disconnected from line rclk (No. 29 in FIG. 1) by briefly elevating node 22d of X decoder 22. The elevated node 22d in excess of VDD by at least Vtn discharges X decoder node 22b to X decoder node 22a which is at VDD. Additionally, bitlines (Nos. 110, 112 in FIG. 1) are isolated from sense amplifier (No. 60a, b in Fib.

1) by switching isoc node (No. 142 in FIG. 1) to GND and isot node (No. 144 in FIG. 1) to VDD thus rendering isolation devices (No. 50 a, b in FIG. 1) nonconductive. These two operations can be performed simultaneously.

When the bitlines and wordlines have been isolated, sense amplifier 60a, b and Y select circuitry 70a, b can be operated in the normal manner as shown in FIG. 3. Additionally, bitline loads 80a, b are now enabled by switching node bllec (No. 140 in FIG. 1) to GND. Since sense amplifier (No. 60a, b in FIG. 1) is disconnected from the bitline, both nodes bt and bc (Nos. 110, 112 in FIG. 1, respectively) can be charged by bitline load MOSFETS mlt and mlc (Nos. 82a, b, 84a, b, in FIG. 1, respectively) to VDD. If the physical process design of the memory cell provides for sufficient parasitic and MOSFET capacitive coupling between the wordline and half bitlines bt, bc (Nos. 110, 112 in FIG. 1, respectively), then the wordline will be boosted above VDD as the bitlines rise thus allowing a high level of VDD to be written into the memory cell. Optionally, a traditional peripheral rclk boost circuit could be used to supplement the wordline to bitline self boosting effect. In this latter case, X decoder node (No. 12b in FIG. 1) would be left in its high voltage state. In either case since the wordline is boosted as bc rises, the electric fields in the memory cell access MOSFETS mc are substantially reduced in comparison to the method of operation shown in FIG. 2.

When bitline bt (No. 110 in FIG. 1) has reached VDD, all selected memory cells have been written to VDD. Now isolation devices (No. 50a, b in FIG. 1) are returned to their conductive state by switching isoc node (No. 142 in FIG. 1) to VDD and isot node (No. 144 in FIG. 1) to GND. As the bc signal (taken off bc node 112 in FIG. 1) falls, wordline wl0 (No. 18a in FIG. 1) will now be capacitively coupled down to bc (No. 112 in FIG. 1) due to the capacitive coupling between wordline and bitlines as shown in FIG. 3. If the coupling effect caused by only half of the half bitlines (bc but not bt for example) is insufficient to adequately reduce the wordline voltage, then an N channel MOSFET that operates in a manner similar to X decoder MOSFET mb (No. 22g in FIG. 1) may be added to discharge the wordline to VDD. Alternately, if a traditional boosted rclk circuit has been used and X decoder node 22b is left in its boosted state, then simply resetting the rclk boost capacitor of such rclk booster circuit should reduce the wordline voltage sufficiently to minimize oxide stress as half bitline bc (No. 112 in FIG. 1) discharges to GND.

When node bc (No. 112 in FIG. 1) has reached GND or a predetermined level above GND as shown in FIG. 3, then the wordline wl0 (No. 18a in FIG. 1) can be turned off and the cycle completed in the traditional manner.

It can be seen from the foregoing that the invention disclosed here provides a unique method for changing the operation of a conventional DRAM in a way that boosts the wordline through wordline to bitline capacitive coupling. In accordance with the inventive method, when the wordline level reaches VDD, the decoder is disabled causing the wordline to stay at the VDD level. The sensing amplifier is also caused to be disabled so as to allow the wordline voltage to track the bitline voltage through capacitive coupling across the access MOSFET of the memory cell being read or written to. As a result, the wordline voltage is increased to a supervoltage as the bitline voltage increases. Since the sensing amplifier is disabled during this time, the disabled bitline also tracks the enabled bitline through capacitive coupling. After the supervoltage is reached on the wordline, the sensing amplifier is enabled causing feedback from the amplifier to drive the wordline voltage toward the VDD level and the disabled bit toward GND during this time. At the end of the wordline clock signal, the voltage is at GND and each of the bitlines are returned to their neutral mid-voltage level. The foregoing steps can be repeated as needed for further read or write operations.

While the invention has been described in terms of specific embodiments, it will be appreciated that variations and modifications may be made in the structure and mode of operation without departing from the spirit and scope of the invention as herein claimed.

What is claimed is:

1. A method for boosting the voltage level of a wordline in a DRAM having bitlines, sense amplifiers, isolation devices, and bitline loads comprising the steps of:

driving said wordline to a first high voltage level by a driver circuitry;

disconnecting said wordline from said driver circuitry;

isolating said bitlines from said sense amplifier so as to allow the wordline voltage to track the voltage of said bitlines;

charging said bitlines through said bitline loads;

wherein capacitive coupling between said wordline and said bitlines causes said wordline to so track the voltage of said bitlines, as said bitlines are being charged, as to be boosted above said first high voltage level to a second higher voltage level.

2. The method of claim 1 wherein said driver circuitry is a clock circuit.

3. The method of claim 1 wherein said bitlines are isolated from said sense amplifier by switching an isoc node of said isolation device to a ground voltage (GND) and an isot node of said isolation device to a supply voltage (VDD), thus rendering said isolation device nonconductive.

4. The method of claim 3 wherein the disabling of said wordline and isolation of said bitlines occurs simultaneously.

5. The method of claim 3 further comprising the step of switching the isoc node of said isolation device to VDD and the isot node to GND after said bitlines reach VDD so as to return said isolation device to its conductive state.

6. The method of claim 5 wherein said wordline is capacitively coupled down as said bitlines fall.

7. The method of claim 6 wherein an additional circuitry is added to discharge the wordline to VDD.

8. The method of claim 7 wherein the wordline is discharged to VDD through a boosted clock circuit.

9. The method of claim 6 further comprising the step of turning off the wordline.

10. The method of claim 1 wherein said bitline loads are enabled by switching a node bllec of said bitline loads to a ground voltage (GND).

11. The method of claim 1 wherein said wordline is connected to a peripheral boost circuit to supplement the voltage boost provided to said wordlines by said capacitive coupling between said wordline and bitlines.

12. The method of claim 1 wherein said wordline is driven by an X decoder having a MOSFET output sourced with a wordline clock signal, said wordline becoming disabled upon application of a supervoltage on the gate of said MOSFET.

13. The method of claim 1 wherein said capacitive coupling is provided by the channel capacitance of a memory cell MOSFET.

14. The method of claim 1 further comprising the steps of:

enabling said sense amplifier, after a supervoltage is reached on said wordline, to cause feedback from said amplifier to said wordline to drive the voltage level on said wordline toward a supply voltage (VDD).

15. The method of claim 14 wherein said feedback from the amplifier further drives the disabled bitline toward a ground voltage.

16. The method of claim 1 further comprising the steps of:

initializing said DRAM by driving: (i) wordlines to a ground voltage (GND) so as to render all memory cell access and Y select MOSFET's nonconductive, (ii) a bitline load control signal to a supply voltage (VDD) so as to render all bitline load MOSFETS nonconductive, (iii) driving control signals pblt to VDD so as to drive precharge MOSFETS into their conductive state of precharging all half bitlines bt and bc to a voltage level vbeq; (iv) drive control signals isoc and isot to VDD and GND, respectively, so as to set said isolation device into its conductive state of precharging sense amplifier nodes to have bitlines bt and bc respectively, and hence to VDD/2, and (v) driving sense and restore lines to VDD/2 so that all sense amplifier MOSFETS are in a nonconductive state.

17. The method of claim 1 wherein a read is initialized from said DRAM by:

(i) switching a pblt node to a ground voltage (GND) so as to isolate said bitlines of a selected array and their associated sense amplifier nodes from a precharge voltage vbeq;

(ii) enabling one of a plurality of wordline decoders to prepare to connect a memory cell to each bitline in the selected array by supplying an address on the X address bus;

(iii) initiating the transition of a wordline clock rclk from GND to a high voltage level;

(iv) after said wordline has reached a supply voltage (VDD) or above, disconnecting said wordline from the line rclk;

(v) switching an isoc node to GND and an isot node to VDD thus isolating said bitlines from said sense amplifiers and rendering said isolation devices nonconductive, wherein after said bitlines and wordlines have been isolated, said sense amplifier and Y select circuitry can be operated in a normal manner;

(vi) enabling said bitlines whereby capacitance coupling of wordline to said bitlines will cause said wordline to track said bitline voltage level;

(vii) when all selected memory cells have been written to VDD, switching isoc node to VDD and isot node to GND to return said isolation devices to their conductive state, where by the capacitance coupling of wordline to said bitlines will cause said wordline to pull down in voltage level;

(viii) when said bitlines have reached GND or a predetermined level above GND, turning off said wordline, and completing the cycle in a traditional manner;

(ix) repeating the foregoing steps as needed for further read or write operations.

18. A method for boosting a wordline voltage in a DRAM comprising the steps of:

isolating bitlines of a selected array from a precharge voltage;

enabling one of a plurality of wordline decoders to prepare to connect a memory cell to the bitline in the selected array;

initiating the transition of a wordline clock from a logic low to a logic high state; wherein the appropriate memory cell access MOSFETS are made conductive so as to allow the memory cells to be discharged to or be charged from their respective half bitlines, depending on whether the operation is a read or write operation;

isolating said bitlines from associated sense amplifiers thereby causing isolation devices to be rendered non-conductive;

disconnecting said wordline from said transition clock after said wordline reaches a supply voltage (VDD) or above;

enabling said bitlines to charge to VDD whereby said voltage on said wordline is caused to track the voltage of said bitline toward VDD through capacitive coupling;

enabling said isolation devices to return to their conductive state so as to allow the voltage level of said wordline to track the voltage of said bitline toward a ground voltage (GND) through capacitive coupling;

disabling said wordline when said bitline has reached GND or a predetermined level above GND.

* * * * *